(12) United States Patent
Cheng et al.

(10) Patent No.: US 8,404,540 B2
(45) Date of Patent: Mar. 26, 2013

(54) DEVICE AND METHOD OF REDUCING JUNCTION LEAKAGE

(75) Inventors: Kangguo Cheng, Albany, NY (US); Bruce B. Doris, Albany, NY (US); Ali Khakifirooz, Albany, NY (US); Pranita Kulkarni, Albany, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/446,602

(22) Filed: Apr. 13, 2012

(65) Prior Publication Data

US 2012/0193710 A1  Aug. 2, 2012

Related U.S. Application Data

(62) Division of application No. 12/789,839, filed on May 28, 2010, now Pat. No. 8,202,767.

(51) Int. Cl.
*H01L 21/8238* (2006.01)
(52) U.S. Cl. ...................................... 438/231
(58) Field of Classification Search ............ 438/231
See application file for complete search history.

(56) References Cited

U.S. PATENT DOCUMENTS

| 5,953,605 | A  | * | 9/1999  | Kodama ................ 438/231 |
| 5,967,794 | A  |   | 10/1999 | Kodama |
| 6,087,235 | A  |   | 7/2000  | Yu |
| 7,528,056 | B2 |   | 5/2009  | Ieong et al. |
| 2007/0155073 | A1 | * | 7/2007  | Goktepeli et al. ....... 438/197 |
| 2009/0294860 | A1 | * | 12/2009 | Mowry et al. .......... 257/368 |

OTHER PUBLICATIONS

A. Wei et al. "Multiple Stress Memorization in Advanced SOI CMOS Technologies", Symp. VLSI Tech, 2007, pp. 216-217.
R. A. Donaton, et al., Design and fabrication of MOSFETs with a reverse embedded SiGe (Rev, e-SiGe) structure, IEDM Tech. Dig., 2006.
K. Yako et al. "Aggressive Design of Millisecond Annealing Junctions for Near-Scaling-Limit Bulk CMOS Using Raised Source/Drain Extensions," IEDM Tech. Dig., 2008.

* cited by examiner

*Primary Examiner* — Charles Garber
*Assistant Examiner* — Andre' C Stevenson
(74) *Attorney, Agent, or Firm* — Tutunjian & Bitetto, P.C.; Louis Percello

(57) ABSTRACT

A device and method for reducing junction leakage in a semiconductor junction includes forming a faceted raised structure in a source/drain region of the device. Dopants are diffused from the faceted raised structure into a substrate below the faceted raised structure to form source/drain regions. A sprinkle implantation is applied on the faceted raised structure to produce a multi-depth dopant profile in the substrate for the source/drain regions.

10 Claims, 6 Drawing Sheets

DEVICE AND METHOD OF REDUCING JUNCTION LEAKAGE

RELATED APPLICATION INFORMATION

This application is a Divisional application of co-pending U.S. patent application Ser. No. 12/789,839 filed on May 28, 2010, incorporated herein by reference in its entirety.

BACKGROUND

1. Technical Field

The present invention relates to semiconductor devices and processing and more particularly to a structure and method for forming structures that reduce junction leakage.

2. Description of the Related Art

Junction leakage becomes a serious problem for low power technologies and particularly for technologies where devices are scaled beyond a 32 nm node. To control device short channel effects, dopant diffusion should be limited. This is done by reducing the thermal budget, which in turn results in incomplete removal of the defects generated by dopant ion implantation. Also, with very shallow junctions, the space between a silicide and junction becomes small, which results in excessive junction leakage.

Raised source drain structures are considered as a way to alleviate these problems. However, conventional raised source drain structure leads to excessive increases in the device parasitic capacitance. Depending on the integration scheme, disposable spacers might be needed, which make the process more complicated. In addition, there are concerns about junction leakage at an edge of the shallow trench isolation (STI). Usually a divot exists at the STI edge and if the junction is not deep enough at this point, silicide formation at the STI edge causes additional leakage.

SUMMARY

A device and method for reducing junction leakage in a semiconductor junction includes forming a faceted raised structure in a source/drain region of the device. Dopants are diffused from the faceted raised structure into a substrate below the faceted raised structure to form source/drain regions. A sprinkle implantation is applied on the faceted raised structure to produce a multi-depth dopant profile in the substrate for the source/drain regions.

Another method for reducing junction leakage in a semiconductor device includes forming device isolation structures in a substrate; forming a gate stack having a first spacer formed on lateral sides thereof on the substrate; forming a faceted raised structure in a source/drain region of a device; diffusing dopants from the faceted raised structure into the substrate below the faceted raised structure to form source/drain regions; applying a sprinkle implantation on the faceted raised structure to produce a multi-depth dopant profile in the substrate for the source/drain regions; and forming a silicide on the faceted raised structures.

A semiconductor device includes a gate stack formed on a semiconductor substrate and source/drain regions formed adjacent to the gate stack having faceted raised structures formed on the substrate and having diffused dopant regions in the substrate below the faceted raised structures. A multi-depth dopant profile is formed in the substrate for the source/drain regions to reduce junction leakage.

A semiconductor device includes a gate stack formed on a semiconductor substrate and source/drain regions formed adjacent to the gate stack having faceted raised structures formed on the substrate and having diffused dopant regions in the substrate below the faceted raised structures. A multi-depth dopant profile is formed in the substrate for the source/drain regions. The multi-depth dopant profile extends between the gate stack and a shallow trench isolation region and has a greatest depth at the shallow trench isolation region to reduce junction leakage. The greatest depth corresponds to the facets of the faceted raised structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

A faceted epitaxially raised source/drain structure and method are described to reduce the junction leakage in accordance with one embodiment. Source/drain (S/D) implantation is avoided to eliminate the generation of defects. A shallow junction is obtained which significantly reduces the junction capacitance and improves device short channel control. A low-dose "sprinkle" implant is used, which employs the facet nature of the epitaxial layer to reduce junction leakage at an edge of a shallow trench isolation (STI).

It is to be understood that the present invention will be described in terms of a given illustrative architecture; however, other architectures, structures, substrate materials and process features and steps may be varied within the scope of the present invention. The circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
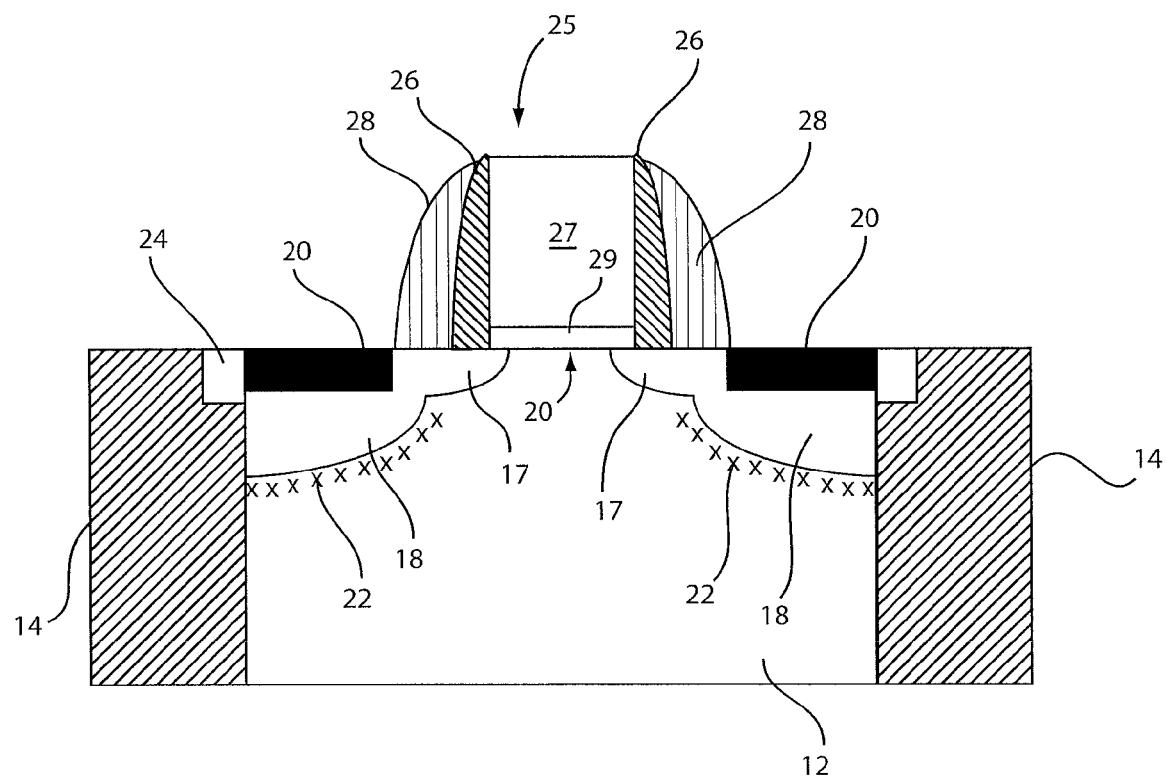
FIG. 1 is a cross-sectional view of a prior art MOSFET.

Referring now to the drawings in which like numerals represent the same or similar elements and initially to FIG. 1, a prior art device structure 10 is shown for comparative purposes. Device 10 shows a conventional metal oxide semiconductor field effect transistor (MOSFET) structure. Source/drain (S/D) extensions 17 and deep S/D junctions 18 are formed by implanting dopant atoms into the substrate 12, respectively, after first spacers 26 and second spacers 28 are formed to offset the junction 18 from a channel 20. To obtain shallow junctions, thermal budget to anneal the implants should be reduced, but this leads to an incomplete removal of the defects 22 caused by the high-dose ion implant. In addition, the so-called transient enhanced diffusion which is caused by excess point defects generated by ion implantation makes it difficult to obtain shallow junctions.

The structure 10 includes the semiconductor substrate 12 having devices separated by shallow trench isolation regions 14. Source and drain junctions 18 have a silicide 20 formed thereon. Junction leakage occurs especially at an edge of the shallow trench isolation (STI) 14. Usually a divot 24 exists at the STI edge and if the junction 18 is not deep enough at this point, silicide formation at the STI edge causes additional leakage.

Implantation of source/drain regions generates implant defects 22 in the junction area 18. Junction leakage occurs especially at an edge of the shallow trench isolation (STI) 14. Usually a divot 24 exists at the STI edge and if the junction 18 is not deep enough at this point, silicide formation at the STI edge causes additional leakage.

Device 10 includes a gate stack 25 having a gate conductor 27 and a gate dielectric 29. First spacers 26 and second spacers 28 are formed on lateral sides of the gate stack 25.

Figure 2:
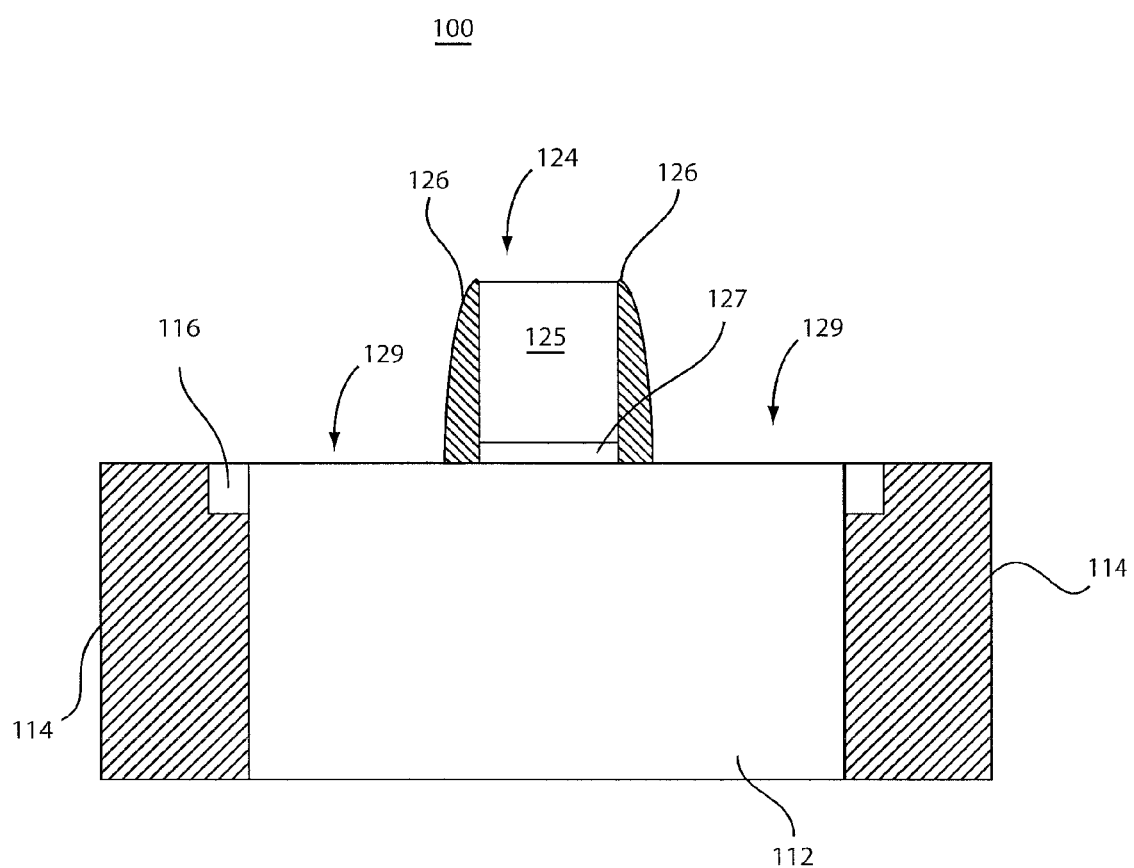
FIG. 2 is a cross-sectional view of a substrate having shallow trench isolation regions and a gate stack formed thereon in accordance with one illustrative embodiment.

Referring to FIG. 2, a partially fabricated semiconductor device 100 is illustratively shown in accordance with one embodiment. Device 100 includes a semiconductor substrate 112 having device regions separated by shallow trench isolation (STI) regions 114. The substrate 112 may include a suitable substrate material, for example, substrate 112 may include Gallium Arsenide, monocrystalline silicon, Germanium, bulk materials or any other material or combination of materials. In some embodiments, the substrate 112 further comprises other features or structures that are formed on or in the semiconductor substrate in previous process steps. The STI regions 114 may include an oxide, such as a silicon dioxide or other dielectric material. A divot 116 forms at the upper most interface between the substrate 112 and the STI material (114). This divot 116 forms as a result of normal processing and is not easily avoided.

Device 100 includes a gate stack 124 having a gate conductor 125 and a gate dielectric 127. Spacers 126 have been formed on the gate stack 124 and may include a silicon nitride or other suitable material. Areas 129 adjacent to the gate stack 124 are employed in forming a source and a drain for the device 100.

Figure 3:
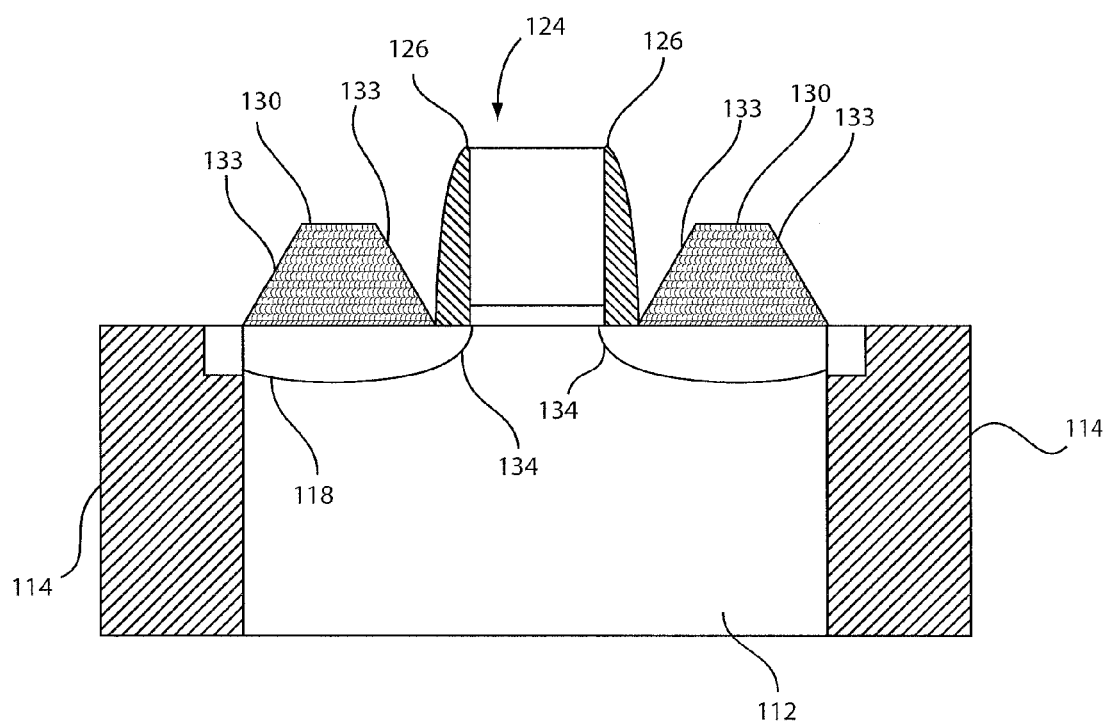
FIG. 3 is a cross-sectional view of the substrate of FIG. 2 having faceted raised portions formed on the substrate and diffused dopant regions formed below the faceted raised portions in accordance with one illustrative embodiment.

Referring to FIG. 3, after device isolation using STI 114, formation of the gate stack 124, and the formation of the first spacer 126 as shown in FIG. 2, a faceted epitaxial layer 130 is formed in source/drain regions. This layer 130 can be grown with in-situ dopants present at the time of formation of the epitaxial grown layer 130, or the layer 130 can be implanted with dopant species after its initial deposition. Layer 130 may include a crystalline silicon material, silicon germanium, silicon carbide, in-situ boron doped silicon germanium, in-situ phosphorous doped silicon carbide, in-situ phosphorous doped silicon, in-situ arsenic doped silicon, in-situ phosphorous doped silicon germanium, etc. Layer 130 is implanted with dopants, which include B, $BF_2$ or other p-type dopants for p-type devices and include As, P or other n-type dopants for n-type devices.

In one embodiment, an annealing step is performed to drive in the dopants from the layer 130 to the substrate 112 and form S/D extensions 134. Optionally, an implant can be done from the area between a facet 133 of layer 130 and the gate spacer 126 to form the extension 134 or to control the diffusion of the dopants prior to the annealing step. This step may be implemented by forming a masking layer (not shown) to protect other areas of the device from the implantation. Optional halo implants may also be performed after the extension 134 formation through the space between the facet 133 and the spacer 126. Depending on the method for forming the extensions 134, dopant densities of between about $1 \times 10^{19}/cm^3$ and $8 \times 10^{21}/cm^3$ are preferable. The halo implants are may include dopants such as B, $BF_2$, In, As, etc. having a density of between about $1 \times 10^{18}/cm^3$ and $5 \times 10^{20}/cm^3$.

Figure 4:
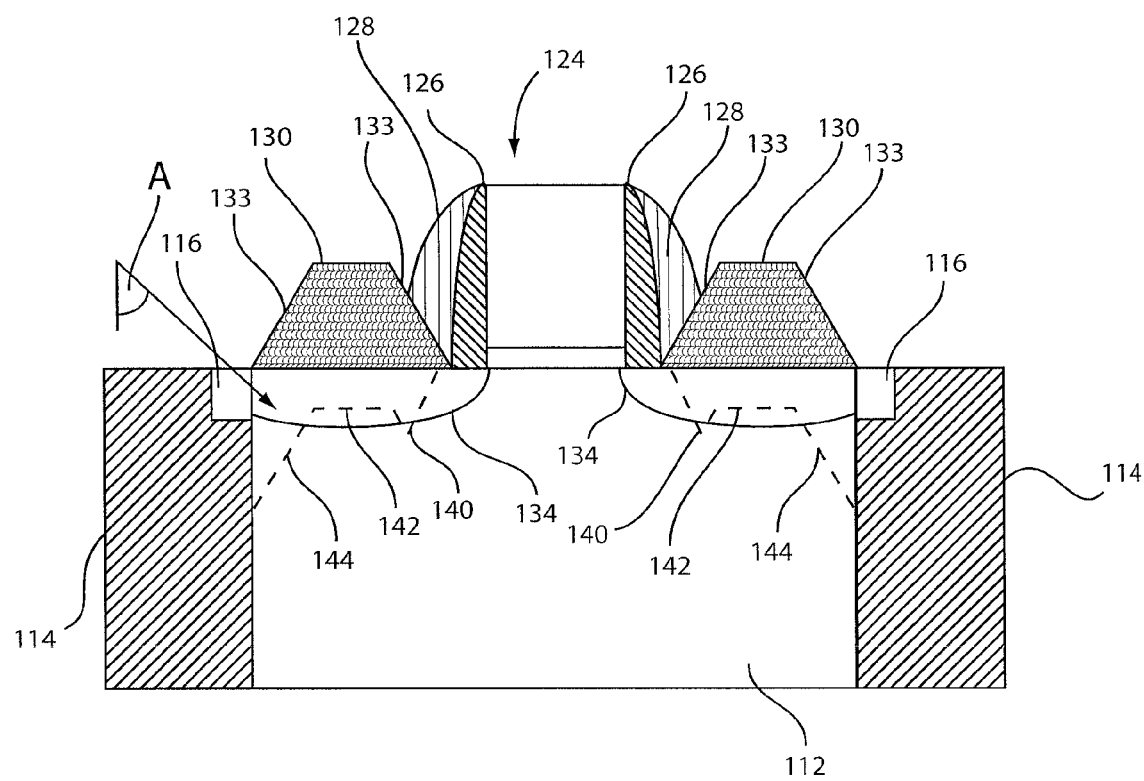
FIG. 4 is a cross-sectional view of the substrate of FIG. 3 having a second spacer formed and a sprinkle implant, which forms a multi-depth dopant profile below the faceted raised portions in accordance with one illustrative embodiment.

Referring to FIG. 4, a second spacer 128 is formed over the first spacer 126 and includes a similar material (e.g., silicon nitride). A low-dose implant (e.g., dose between about $1 \times 10^{13}$ $cm^{-2}$ to about $1 \times 10^{14}$ $cm^{-2}$) is performed. An illustrative energy level includes, e.g., 2-50 KeV depending on thickness (e.g., Si thickness). The low-dose implant may be referred to as a "sprinkle" implant to distinguish it from normal implantation.

In the area near the STI 114 where the epitaxially formed layer 130 has facets 133, the sprinkle implant penetrates deeper into the substrate 112 at portion 140, while in the rest of the S/D region, the implant is not as deep in portion 142. So, while the S/D junction/extension 134 is shallow for the most part as defined by the dopant drive-in, near the STI edge, the junction is deeper in portion 144. The deeper portions 140 and 144 (and shallow portions 142) result from the faceted geometry of the layer 130. Optionally, the low-dose implant can be performed at an angle A to provide an even deeper junction at the location of the divot 116.

A relatively low thermal budget anneal is done to activate the dopants from the low-dose implant (sprinkle implant). This can be a low temperature spike anneal, e.g., less than or equal to about 1000° C., a laser anneal, a msec anneal or a combination of these. Silicide 150 (FIG. 5) is then formed and complementary metal oxide semiconductor (CMOS) processing continues as normal.

Figure 5:
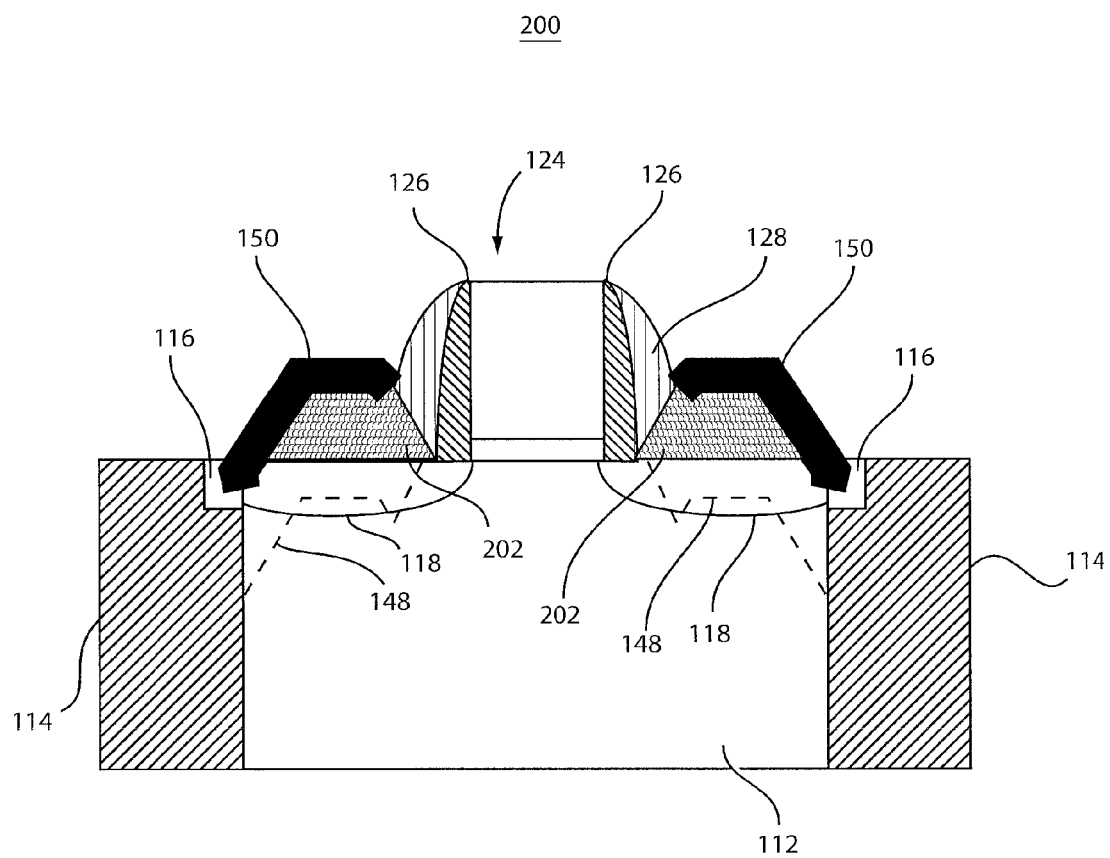
FIG. 5 is a cross-sectional view of a semiconductor device having reduced junction leakage in accordance with one illustrative embodiment.

Referring to FIG. 5, a completed structure 200 for an exemplary device is illustratively shown. A faceted epitaxially raised source/drain structure 202 is provided which along with other features reduces junction leakage. Advantageously, S/D implantation, which generates defects at the junction interface is avoided to eliminate the generation of these defects. Instead, a shallow junction 118 is obtained which significantly reduces the junction capacitance and improves device short channel control. A low-dose "sprinkle" implant is provided to form a multi-depth dopant profile 148 in the substrate, which employs the facet nature of the raised structure 202 to reduce junction leakage at the STI edge.

Silicide 150 is formed over the structures 202 and can even cover a lateral portion of the junction 118 in the divot 116. With reduced capacitance and junction leakage, significant performance benefits are achieved, and long term effects of implant defects are avoided, among other things.

Figure 6:
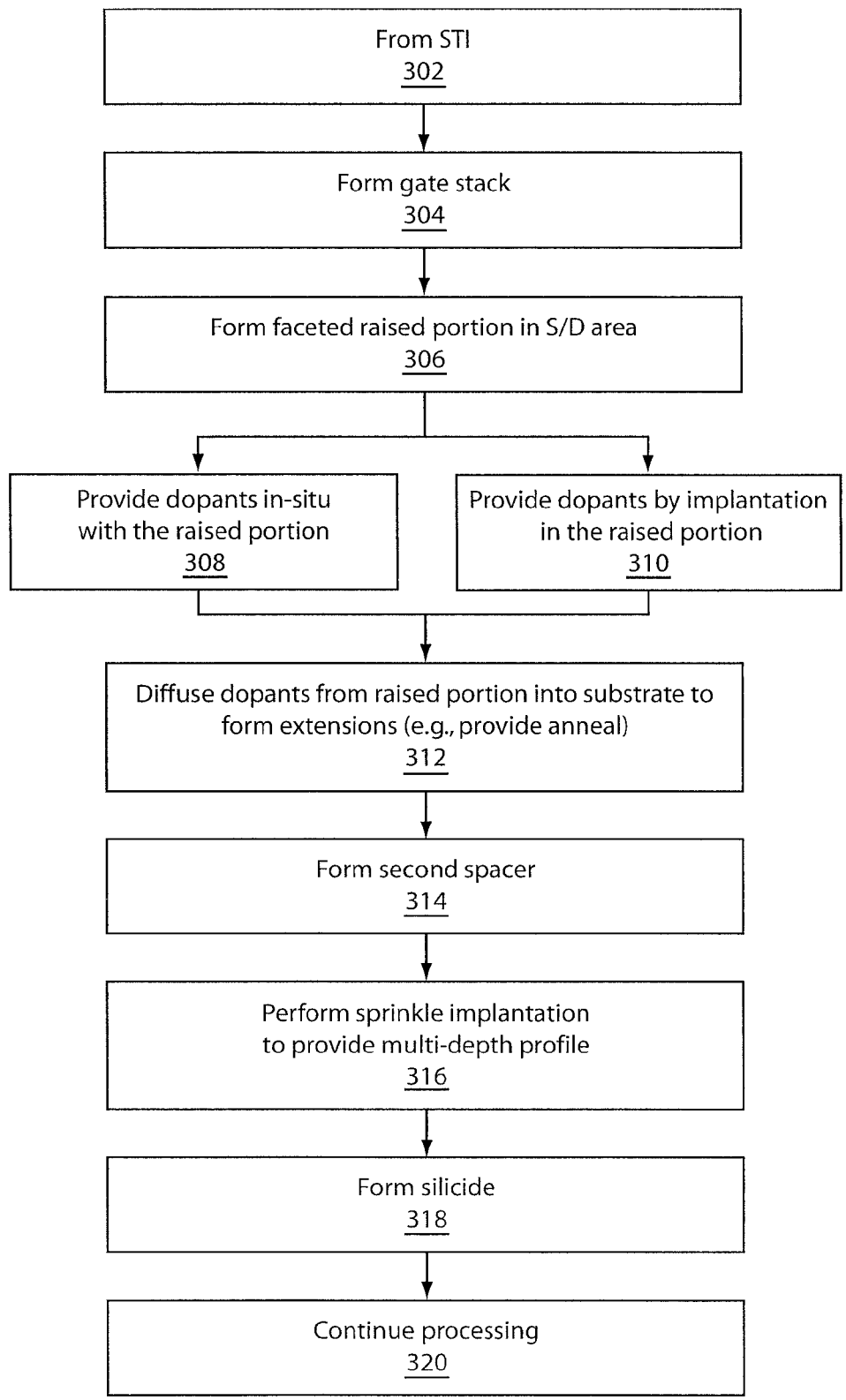
FIG. 6 is a flow diagram showing a method for reducing junction leakage in a semiconductor device in accordance with one embodiment.

Referring to FIG. 6, a method for fabrication of a device with improved junction leakage performance is illustratively depicted. In block 302, device isolation regions or shallow trench isolation regions are formed in a substrate. In block 304, a gate stack is formed, which may include a gate oxide, gate conductor, and a first spacer. In block 306, a faceted raised structure is formed in a source/drain region of a semiconductor device. The faceted raised structure may include epitaxially growing the faceted raised structure on a surface of the substrate.

In block 308, dopants may be provided in-situ during the formation of the faceted raised structure, or dopants may be implanted into the faceted raised structure after formation of the faceted raised structure in block 310. In block 312, these dopants are diffused from the faceted raised structure into the substrate below the faceted raised structure to form source/drain regions. This may be assisted by annealing the device.

In block 314, a second spacer may be formed after forming the faceted raised structure. In block 316, a sprinkle implantation may be applied on the faceted raised structure to produce a multi-depth dopant profile in the substrate for the source/drain regions. The sprinkle implantation may provide a dose of between about $1\times10^{13}$ cm$^{-2}$ to about $1\times10^{14}$ cm$^2$. The multi-depth dopant profile may include a greater depth corresponding to facets of the faceted raised structure. The multi-depth dopant profile preferably extends between a gate stack and a shallow trench isolation region and the multi-depth dopant profile includes a greatest depth at the shallow trench isolation region. The multi-depth dopant profile is preferably formed by a combination of a shape of the faceted raised structures and dopant implant conditions to provide dopants at different depths. In block 318, a silicide is formed on the faceted raised structures. In block 320, processing continues to complete the device.

Having described preferred embodiments of a device and method for reducing junction leakage (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a gate stack formed on a semiconductor substrate;
source/drain regions formed adjacent to the gate stack having faceted raised structures formed on the substrate and having diffused dopant regions in the substrate below the faceted raised structures; and
a multi-depth dopant profile formed in the substrate for the source/drain regions to reduce junction leakage, the multi-depth dopant profile for at least one of the source/drain regions having a shallow portion between a first deep portion and a second deep portion.

2. The device as recited in claim 1, wherein the multi-depth dopant profile extends between the gate stack and a shallow trench isolation region and having a greatest depth at the shallow trench isolation region.

3. The device as recited in claim 1, wherein the faceted raised structure includes a facet adjacent to the gate stack and a facet adjacent to the shallow trench isolation region.

4. The device as recited in claim 1, wherein the gate stack includes a first spacer formed before the faceted raised structure, and a second spacer formed after the faceted raised structure.

5. The device as recited in claim 4, wherein the second spacer is formed over the first spacer and a portion of the faceted raised structure.

6. The device as recited in claim 1, wherein the multi-depth dopant profile includes a greater depth corresponding to facets of the faceted raised structure.

7. The device as recited in claim 1, further comprising a silicide formed on the faceted raised structure.

8. The device as recited in claim 1, wherein the multi-depth dopant profile is formed by a combination of a shape of the faceted raised structures and dopant implant conditions to provide dopants at different depths.

9. A semiconductor device, comprising:
a gate stack formed on a semiconductor substrate;
source/drain regions formed adjacent to the gate stack having faceted raised structures formed on the substrate and having diffused dopant regions in the substrate below the faceted raised structures; and
a multi-depth dopant profile formed in the substrate for the source/drain regions, the multi-depth dopant profile extending between the gate stack and a shallow trench isolation region and having a greatest depth at the shallow trench isolation region to reduce junction leakage, the greatest depth corresponding to the facets of the faceted raised structure.

10. A semiconductor device, comprising:
a gate stack formed on a semiconductor substrate;
source/drain regions formed adjacent to the gate stack having faceted raised structures formed on the substrate and having diffused dopant regions in the substrate below the faceted raised structures; and
a multi-depth dopant profile formed in the substrate for the source/drain regions to reduce junction leakage, the multi-depth dopant profile having a greatest depth at a shallow trench isolation region.

* * * * *